United States Patent [19]
Naruse et al.

[11] Patent Number: 5,877,540
[45] Date of Patent: Mar. 2, 1999

[54] EPITAXIAL-BASE BIPOLAR TRANSISTOR

[75] Inventors: Hiroshi Naruse, Kanagawa-ken; Hiroyuki Sugaya, Tokyo; Hidenori Saihara; Yoshiro Baba, both of Kanagawa-ken, all of Japan

[73] Assignee: Kabushiki Kaisha Toshiba, Kawasaki, Japan

[21] Appl. No.: 766,856

[22] Filed: Dec. 13, 1996

[30] Foreign Application Priority Data

Dec. 15, 1995 [JP] Japan ................................. 7-347688

[51] Int. Cl.⁶ ..................... H01L 27/082; H01L 27/102; H01L 29/70
[52] U.S. Cl. ....................... 257/587; 257/588; 257/592
[58] Field of Search ................................. 257/197, 198, 257/591, 592, 587, 588

[56] References Cited

U.S. PATENT DOCUMENTS 5,712,505   1/1998   Nakamura ............................... 257/592

*Primary Examiner*—Wael Fahmy
*Attorney, Agent, or Firm*—Finnegan, Henderson, Farabow, Garrett & Dunner, L.L.P.

[57] ABSTRACT

A semiconductor device. A semiconductor substrate has a first conductivity. A first insulating layer is on the semiconductor substrate and has an opening so that a portion of the semiconductor substrate is exposed. A semiconductor layer has a second conductivity on the portion. A region in said semiconductor layer prevents a leakage current caused by a minute defect and faceting.

15 Claims, 9 Drawing Sheets

EPITAXIAL-BASE BIPOLAR TRANSISTOR

FIELD OF THE INVENTION

This invention relates to a semiconductor device and a manufacturing method for providing a semiconductor layer formed by the selective epitaxial growth or non-selective epitaxial growth on a semiconductor substrate.

DESCRIPTION OF THE RELATED ART

In recent years, devices which achieve speed-up and high integration have been proposed and implemented on the way to practical use, by forming a shallow junction in active regions, e.g. a base layer of the bipolar element, and source/drain regions of the CMOS element, and a channel region by using the low temperature epitaxial growth method. FIG. 1 shows a sectional view of the conventional semiconductor substrate where a silicon layer has selectively grown on the surface of a semiconductor layer. FIG.2 shows a sectional view of a semiconductor substrate where a conventional bipolar element is formed. An insulating layer 2 consists of, for example, a $SiO_2$ layer has about 100 nm layer thick formed on an n-type silicon semiconductor substrate 1, as shown in FIG. 1. Afterwards, opening 21 is formed on the region where a basic region of insulating layer 2 is formed. It is necessary to choose the material to facilitate selective epitaxial growth as an insulating layer type, for which, for instance, the $SiO_2$ layer is suitable. Etching for forming the opening portion can control an amount of the pattern transformer by using anisotropic etching. However, it is required to remove any damaged layer by wet-etching etc., because damage occurs in the semiconductor substrate when using RIE(Reactive Ion Etching). Next, a Boron(B) doped semiconductor layer 3 is formed in opening 21 formed in the semiconductor substrate 1 by selective epitaxial growth.

It is preferable to define the thickness layer at about 50 to 70 nm and the boron density at about 5 to $7 \times 10^{18} cm^{-3}$. Moreover, a sharp base profile can be formed at about 700° C. as a growing temperature. The selective growth layer can be formed as growing gas by using a $SiH_2Cl_2$ or $SiH_4$+HCL gas system. It is preferable to provide a structure indicating the shape of the edge portion of the semiconductor layer 3, where faceting does not occur. Next, a polysilicon layer 5 where p-type impurities are doped and an insulating layer (made of SiO2)6 are formed on the insulating layer 2 and on the semiconductor layer 3. Successively, the polysilicon layer 5 and the insulating layer 6 are patterned by anisotropic etching, as shown in FIG. 2. A high impurity density region will exist at the overlap of semiconductor layer 3 and polysilicon layer 5. The high impurity density region promotes a good electrical contact between the semiconductor layer 3 and the polysilicon layer 5.

In this process, the polysilicon layer 5 is used as a base contacting electrode. However, low resistance is preferable due to the necessity for decreasing parasitic resistance. Next, a side-wall insulating layer 7 is formed along a side surface of the polysilicon layer 5 and the insulating layer 6 by anisotropic etching over all the surface. The role of this side wall insulating layer 7 is to separate a base electrode from an emitter electrode, and simultaneously determine the size of the emitter region.

For instance, when the open width of pattern opening 21 is defined as 0.5 μm, the opening width for emitter opening 30 can be limited to about 0.2 μm by providing a 0.15 μm thickness layer for the side-wall insulating layer 7. Next, n-type polysilicon layer 8 is formed in opening 30. Then, n-type emitter diffused region 31 is formed by annealing under the conditions of 1000° C., $N_2$ for 20 seconds approximately. The polysilicon layer 8 is used as an emitter electrode (E). The polysilicon layer 3 is used as a base region. The polysilicon layer 5 is used as an outer base electrode. An opening is formed to expose the layer of the bare substrate on the insulating layers 2 and 6, respectively, where metallic electrodes 9 and 10 are formed so as to contact with this bare substrate. Metallic electrode 9 is used as a base contacting electrode (B), and metallic electrode 10 is used as a collector contacting electrode (C).

There is a problem wherein a minute defect causes a junction Leak defect to occur in the edge portion of the epitaxial growth pattern for the device in order to render such thin epitaxial layers to an active region for practical use. For instance, when the semiconductor layer 3 is grown by the selective epitaxial growth method in opening 21 of the insulating layer 2 formed on the semiconductor substrate 1, as shown in FIG. 1, the opening pattern edge shape for the insulating layer 2, or the thermal stress occurring in the boundary between the insulating layer and the semiconductor layer, cause a minute defect 32 (deposition defect). The defect 32 will increase a junction leak current at leak point 33 in a boundary between the semiconductor layer 3 and the semiconductor substrate 1 field side, which also sharply reduces a yield for the integrated circuit. Then, the selective epitaxial growth causes faceting to generate in the semiconductor layer 3. In this case, there is also a problem that the junction leakage occurs easily in a boundary between the semiconductor layer 3 and the semiconductor substrate 1 because a thickness of the semiconductor layer 3 decreases in an edge region thereof.

SUMMARY OF THE INVENTION

It is an object of the present invention to provide a semiconductor device and a method of manufacturing the same.

A further object of the present invention is to restrain the flow of junction leak current, although minute defects and faceting are generated at an edge portion of the opening of the insulating layer.

To achieve the above objects, the present invention provides a semiconductor device which comprises a semiconductor substrate having a first conductivity, an insulating layer formed on said semiconductor substrate and having an opening so that a portion of said semiconductor substrate is exposed, and a semiconductor layer having a second conductivity and formed at least on said portion. Said semiconductor device also has a means for preventing electric current from being leaked by a minute defect and faceting included in said semiconductor layer.

And the present invention provides a method of manufacturing a semiconductor device which comprises the steps of forming an opening in a first insulating layer formed on a semiconductor substrate having a first conductivity, forming a second insulating layer including an impurity having a second conductivity along with a side surface of said opening, diffusing said impurity to a surface of said semiconductor substrate, and growing a semiconductor layer on an exposed portion of said semiconductor substrate by the epitaxial method.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF DRAWINGS

A more complete appreciation of the present invention and many of its attendant advantages will be readily obtained by reference to the following detailed description considered in connection with the accompanying drawings, in which.

DETAILED DESCRIPTION OF PREFERRED EMBODIMENT

Embodiments of the present invention will be described in detail with reference to the drawings.

Figure 3:
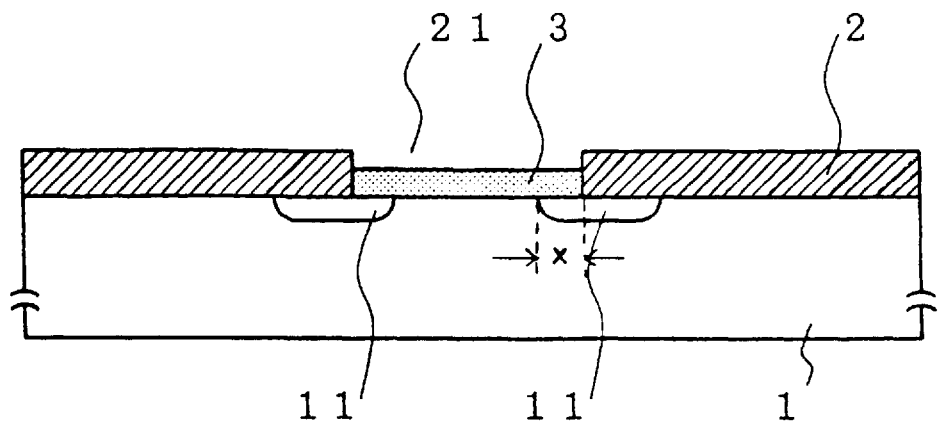
FIG. 3 shows a sectional view of the semiconductor device in the first embodiment of the invention.
Figure 4:
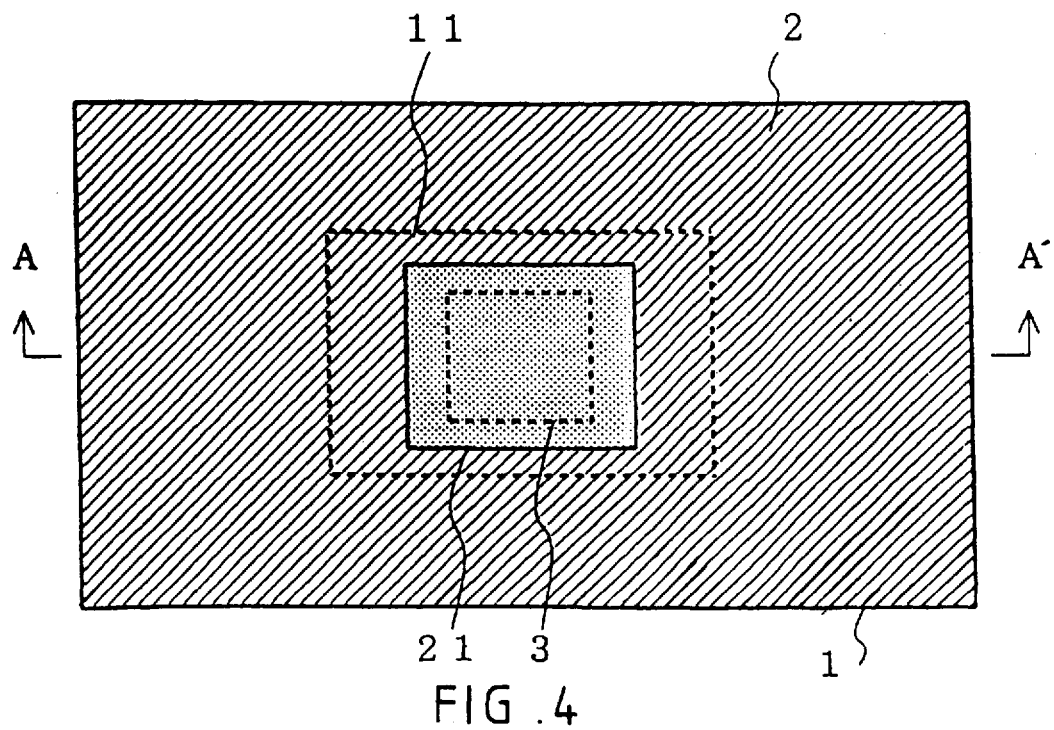
FIG. 4 shows a plan view of the semiconductor device in the first embodiment of the invention.
Figure 5:
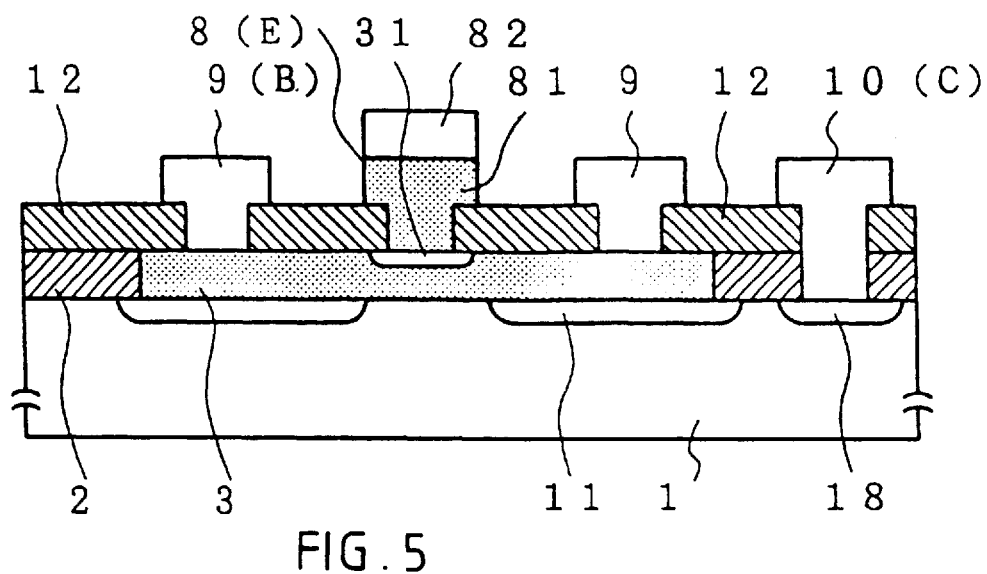
FIG. 5 shows a sectional view of the semiconductor device in the first embodiment of the invention.

To begin with, the first embodiment form of the invention will be described with reference to FIGS. 3, 4, and 5. FIGS. 3 and 4 show the sectional and plan views of the semiconductor substrate. A sectional view of FIG. 4, in the region along the line A—A' is shown in FIG. 3. FIG. 5 shows a sectional view of the semiconductor substrate, where a bipolar transistor is formed. FIG. 3 shows a semiconductor device for the structure such that a p-type semiconductor layer is formed in the insulating layer opening region formed on n-type silicon semiconductor substrate by a low temperature selective epitaxial growth method. First, insulating layer 2 is formed on n-type silicon semiconductor substrate 1 having an impurity density of about $1\times10^{16}$ to $1\times10^{17}$ cm$^{-3}$. Next, a p-type impurity, e.g. boron(B), is implanted into the surface region of semiconductor substrate 1 by the ion implantation method etc. The p-type impurity is diffused by thermal diffusion etc., and a p-type impurity diffused region 11 is formed with the impurity density exceeding about $1\times10^{18}$ cm$^{-3}$ in this region. The diffusion width for this p-type impurity diffusion density region 11 is about 0.5–1.0 $\mu$m, and diffusion depth is about 300–500 nm from the surface of semiconductor substrate 1 to the bottom of the p-type impurity diffusion density region 11. Next, photoresist (Not illustrated in figures) covers insulating layer 2, which is patterned. An opening 21 is formed in the insulating layer 2 by etching, e.g. RIE(Reactive Ion Etching), using the patterned photoresist as a mask.

This opening 21 is formed so that the bottom edge is aligned on p-type impurity diffused region 11. A suitable thickness of the insulating layer 2 is about 100 nm. Using an SiO$_2$ layer etc. would be preferable, because the required thickness of the insulating layer 2 would determine the material upon which the selective epitaxial growth layer grows easily. Using anisotropic etching is capable of controlling the amount of pattern transformation. However, damage might occur in the semiconductor substrate when using RIE. Therefore, it is required to remove this damaged layer by wet etching etc. A p-type silicon semiconductor layer 3, a single crystal of about 50~70 nm layer thickness, is epitaxial-selectively grown on semiconductor substrate 1 surrounded with opening 21 of this insulating layer 2. Growth temperature should be defined at the low temperature of about 700° C. Thereafter, this silicon semiconductor layer 3 is called a selective epitaxial growth layer. The selective epitaxial growth layer 3 solely grows on the opening 21 of the semiconductor substrate 1 of opening 21. The bottom edge is located on the p-type impurity diffused region 11. In this embodiment, the length from the edge of opening 21 to the edge of diffused region 11 existing under selective epitaxial growth layer 3 is about 0.5 $\mu$m.

In this manner, all edge portions of the selective epitaxial growth layer 3 are accommodated and formed adjacent in the p-type impurity diffused region 11. Therefore, even if a minute defect and faceting etc. generate in the edge portion of the selective epitaxial growth layer 3, the boundary between the selective epitaxial growth layer 3 and the semiconductor substrate 1 at this edge portion is kept away from a junction leakage owing to a junction between the p-type impurity diffused region 11 and the semiconductor substrate 1.

Meanwhile, FIG. 5 shows an example of forming a bipolar transistor, where the selective epitaxial growth layer 3 shown in FIG. 3 is provided as a base region. The description concerning the process up to forming the selective epitaxial growth layer 3 is omitted, because the similar process will proceed in this process.

After the selective epitaxial growth layer 3 has grown, insulating layer 12 (CVD-SiO$_2$ layer) is formed on insulating layer 2 and selective epitaxial growth layer 3 by the CVD method etc. Using a patterned photoresist (not illustrated in the figure) which provided as a mask, the opening is formed in the insulating layer 2 by anisotropic etching so that the surface of the selective epitaxial growth layer 3 is exposed. N-type polysilicon semiconductor layer 81 is formed in the opening where selective epitaxial growth layer 3 is exposed. At this time, the impurity of this semiconductor layer 81 diffuses by annealing under the condition of 1000° C., $N_2$ and for 20 sec approximately, when this n-type emitter region 31 is formed.

Polysilicon semiconductor layer 81 is used as an emitter electrode 8(E) together with metallic electrode 82, e.g. aluminium. Selective epitaxial growth layer 3 is used as a base region. Metallic electrode 9, e.g. aluninium, is formed in the other opening where the selective epitaxial growth layer 3 of insulating layer 12 is exposed so as to contact with this selective epitaxial growth layer 3. Metallic electrode 9 is used as a base contacting electrode (B). Metallic electrode 10, e.g. aluminum, is formed in the opening of insulating layer 12 where the surface of the semiconductor substrate 1 is exposed, so as to contact with high impurity density collector contact region 18 in the semiconductor substrate 1. Metallic electrodes 9 and 10 can be formed in the same process. Metallic electrode 10 is used as a collector contacting electrode (C).

The embodiment of this invention employs p-type impurity diffused region 11, together with the outer base diffused region. This outer base diffused region is formed so as to overlap with an edge of the insulating layer, which enables to control the junction leak current between base and collector, without increasing the number of process steps.

Meanwhile, the embodiment of the second invention is described with reference to FIG. 6.

Figure 6:
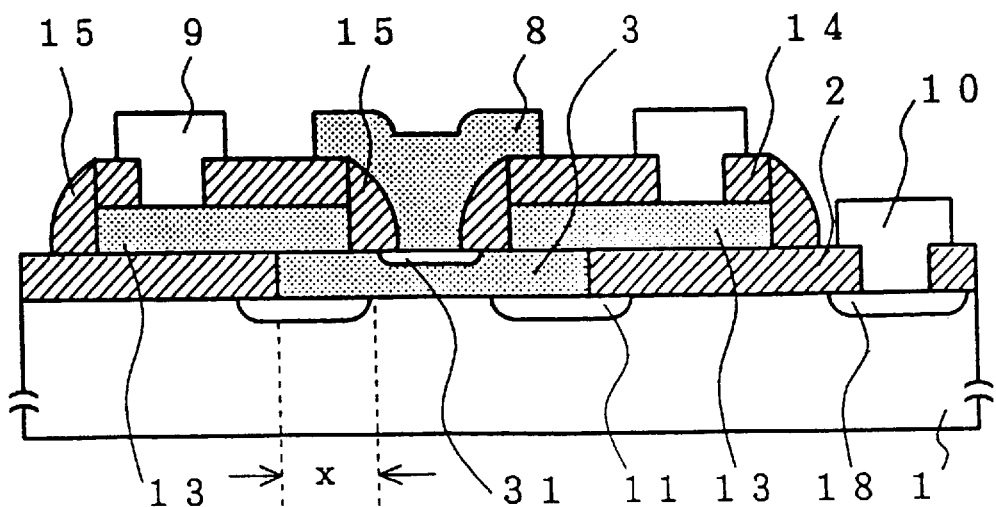
FIG. 6 shows a sectional view of the semiconductor device in the second embodiment of the invention.

FIG. 6 shows a sectional view of the semiconductor device configuration, where the base region for self-aligned bipolar transistor using two layer polysilicon layers is formed by the selective epitaxial growth. Insulating layer 2, e.g. the about 100 nm thick SiO2 layer is formed on n-type silicon semiconductor substrate 1. After then, an opening 21 is formed in the region, where the base region for insulating layer 2 is formed. Next, a selective epitaxial growth layer 3 doped with boron (B) to the opening 21, is grown on the semiconductor substrate. It is preferable to define the layer thickness at 50~70 nm and boron density at $5~7\times10^{18}cm^{-3}$ approximately. Moreover, providing for growth temperature at about 700° C. will result in achieving formation of sharp base profile. The selective growth layer can be developed as a growth gas by using the $SiH_2Cl_2$ or $SiH_4+HCl$ gas system. A structure where faceting does not generate is preferable as the shape of the edge portion of the selective epitaxial growth layer 3. Next, p-type impurity is doped in a polysilicon layer 13 in high density and insulating layer 14 is deposited (CVD-$SiO_2$ layer) by the CVD method. This deposition layer is patterned by anisotropic etching, so that the selective epitaxial growth layer 3 may overlap with the polysilicon layer 13.

In regard to this deposition layer, the emitter opening is formed so that the emitter region may be exposed. In this process, the polysilicon layer 13 is used as an outer base region. However, low resistance is preferable, due to the necessity for proposing parasitic resistance. Moreover, $SiO_2$ is grown by the CVD method etc. A side-wall insulating layer 15 is formed along a side surface of the deposition layer pattern in the p-type polysilicon semiconductor layer 13 and insulating layer 14 by anisotropic etching. This side-wall insulating layer 15 not only separates the base electrode from the emitter electrode, but also determines the emitter size. For instance, when a width of the opening 21 is 0.5 μm, an opening width for the emitter region can be adjusted to about 0.2 μm by setting a thickness of the side-wall insulating layer 15 to 0.15 μm. Next, n-type polysilicon semiconductor layer 8 is formed to the emitter opening. Then, n-type emitter diffused region 31 is formed in the surface region of selective epitaxial growth layer 3 by annealing under the condition of 1000 C, $N_2$ for 20 sec approximately.

Furthermore, p-type impurity diffused region 11 is formed in the surface region of semiconductor substrate 1 under the region where selective epitaxial growth layer 3 overlaps with p-type polysilicon semiconductor layer 13. The edge of the selective epitaxial growth layer 3 is aligned on this p-type impurity diffused region 11 in formation.

A polysilicon semiconductor layer 8 is used as an emitter electrode. The selective epitaxial growth layer 3 is used as a base region. The polysilicon layer 13 is used as an outer base electrode. The insulating layers 2 and 14 form a couple of openings respectively, so that the semiconductor substrate is exposed, and metallic electrodes 9 and 10 are formed so as to contact a surface of the semiconductor substrate. The metallic electrode 9 is used as a base contacting electrode, and the metallic electrode 10 is used as a collector contacting electrode, which is connected with collector contact region 18 with high impurity density in semiconductor substrate 1.

According to this invention, a pattern of the selective epitaxial growth layer 3 relevant to an inner base overlaps with the pattern of the polysilicon layer 13 relevant to an outer base. However, providing an overlapping region in the polysilicon layer 13 for the diffusion source of the p-type impurity, a p-type impurity diffused region 11 can be formed in the surface of the semiconductor substrate 1 in the later annealing process. This p-type impurity diffused region 11 is a pattern which contains all of the edge portion of the selective epitaxial growth layer 3 as a result. Therefore, even if a minute defect or faceting etc. occurs in the edge portion of the selective epitaxial growth layer 3, a junction leakage will not be detected.

In the event that a p-type impurity diffused region 11 is formed, the junction area between a base to a collector increases, which occasionally degrades the operation performance of the bipolar transistor. On the other hand, this invention can minimize increasing a capacity between the base to the collector, by adjusting a length from the edge portion of the selective epitaxial growth layer 3 to the edge portion of the p-type impurity diffused region 11 to 2 μm maximum.

Meanwhile, the third embodiment of the invention is described with reference to FIGS. 7 to 13.

Figure 7:
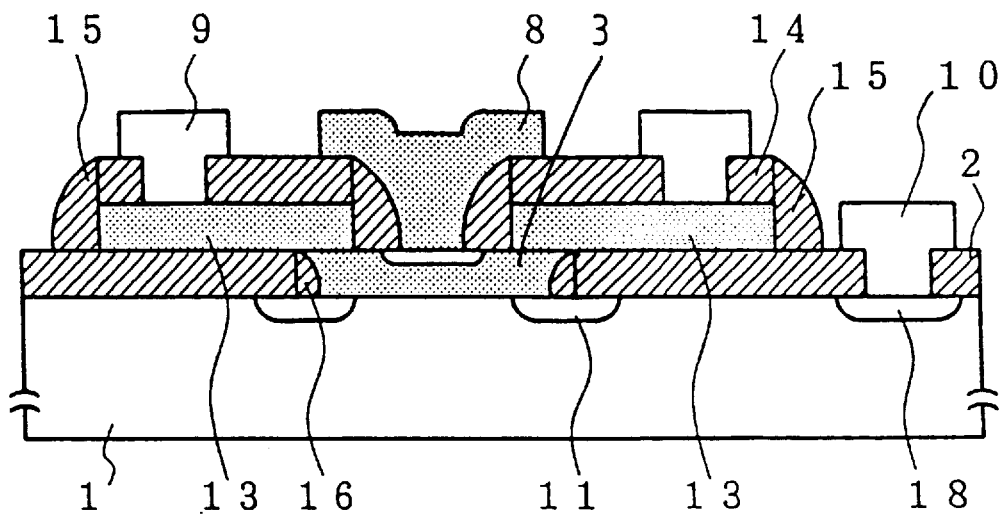
FIG. 7 shows a sectional view of the semiconductor device in the second embodiment of the invention.
Figure 8:
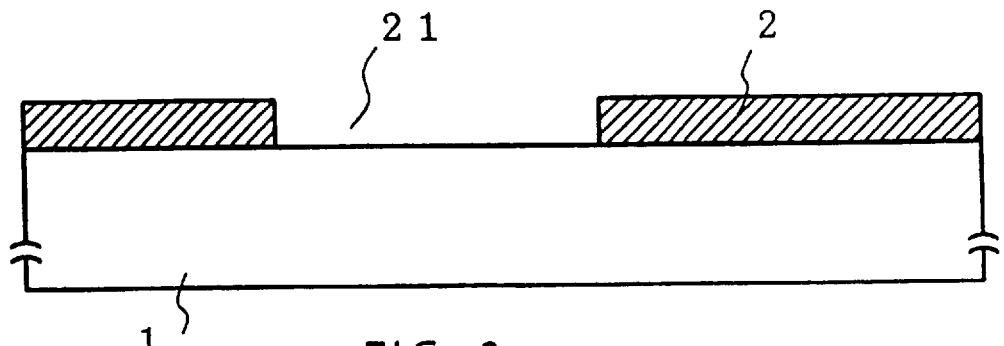
FIG. 8 shows sectional view of the semiconductor device in a manufacturing process in the third embodiment of the invention.
Figure 9:
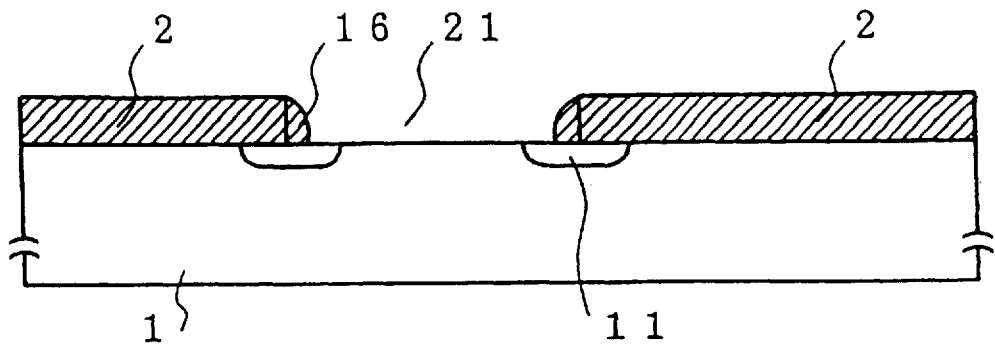
FIG. 9 shows sectional view of the semiconductor device in a manufacturing process in the third embodiment of the invention.
Figure 10:
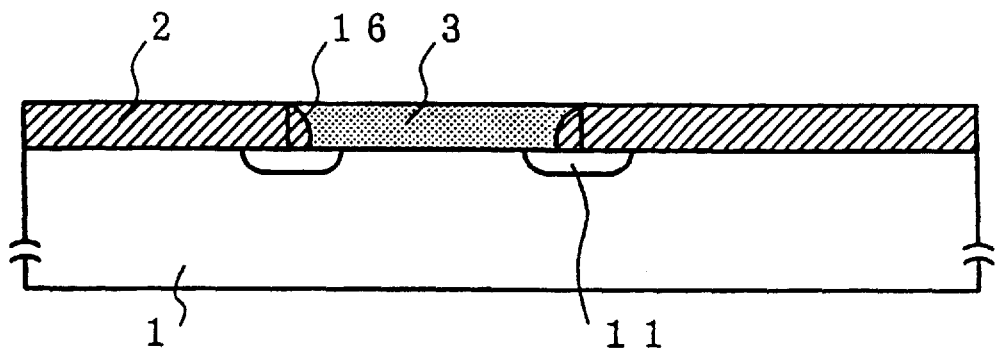
FIG. 10 shows sectional view of the semiconductor device in a manufacturing process in the third embodiment of the invention.

FIG. 7 shows a sectional view of a semiconductor substrate, where a semiconductor device is formed. FIGS. 8 to 13 show a sectional view of the semiconductor device during the manufacturing process. FIG. 7 shows a sectional view of the structure, where the base region of the self-aligned bipolar transistor, using two polysilicon layers, is formed by selective epitaxial growth. An insulating layer 2 is formed on n-type silicon semiconductor substrate 1. In the insulating layer 2, an opening is provided in the region forming the base region. A side-wall insulating layer 16 is formed along a side surface of this opening. A boron-doped silicon semiconductor layer 3 (selective epitaxial growth layer) is formed in this opening by the selective epitaxial growth. The selective epitaxial growth layer 3 is opposite to the insulating layer 2 in the opening through the side-wall insulating layer 16.

The side-wall insulating layer 16 can regulate a width of the opening of the insulating layer 2, and can become a diffusion source to form the impurity diffused region in the surface region of the semiconductor substrate 1. A polysilicon layer 13 and an insulating layer 14 doped with p-type impurity, e.g. boron, in high density are deposited on the insulating layer 2. In these deposition layers, the emitter opening is formed so that an emitter region made in a surface of the selective epitaxial growth layer 3 may be exposed. The polysilicon layer 13 is used as a contacting base electrode, and partially makes contact with the selective epitaxial growth layer 3. A side-wall insulating layer 15 is formed along a side surface of the polysilicon layer 13 and the insulating layer 14. This side-wall insulating layer 15 separates the base electrode from the emitter electrode. In the emitter opening, n-type emitter diffused region 31 is formed in the surface region of the selective epitaxial growth layer 3. Moreover, a p-type impurity diffused region 11 is formed by impurity diffusing from the side-wall insulating layer 16. The edge portion of selective epitaxial growth layer 3 is aligned on this p-type impurity diffused region 11. A polysilicon layer 8 is used as an emitter electrode.

The selective epitaxial growth layer 3 is used as a base region. The polysilicon layer 13 is used as an outer base electrode. The insulating layers 2 and 14 respectively form the opening, so that the surface of the semiconductor substrate 1 and the surface of the polysilicon layer 13 may be exposed respectively, where metallic electrodes 9 and 10 are formed so as to contact with the surface of the semiconductor substrate 1 and the surface of the polysilicon layer 13 respectively. The metallic electrode 9 is used as base contacting electrode, and the metallic electrode 10 is used as a collector contacting electrode and is connected with a collector contact region 18 ofsemiconductor substrate 1.

According to this invention, this p-type impurity diffused region 11 is a pattern which contacts all of the edge portion of the selective epitaxial growth layer 3. Therefore, even if a minute defect and faceting, etc. is generated in the edge portion of selective epitaxial growth layer 3, this is not detected as junction leakage.

When the p-type impurity diffused region 11 is formed, the junction region between a base and a collector increases, which may occasionally deteriorate the operation performance of the bipolar transistor. However, the necessary increase in the base to collector capacity can be controlled to the minimum by providing the distance from the edge of the selective epitaxial growth layer 3 to the edge of the p-type impurity diffused region 11, as 2 $\mu$m maximum, according to the aforesaid invention.

Meanwhile, the method of manufacturing the semiconductor device in the embodiment of this invention is described with referred to FIGS. 8 to 13. This method employs BSG(Boron Silicate Glass) containing the same conductive impurity as the selective epitaxial growth layer 3 (p-type impurity) for a side-wall insulating layer which is used as means to minimize an area of the p-type impurity diffused region made in a exposed surface of the semiconductor substrate 1. In this case, after making an opening pattern of the insulating layer, the BSG layer is formed. The BSG layer is etched with anisotropic etching until the n-type semiconductor substrate 1 is exposed, so that portions of the ESG layer, named as a side-wall insulating layer 16, can be solely remained along the side surface of the insulating layer 2. However, the side-wall insulating layer is predetermined by the BSG layer and an over-etching amount, but can be formed in a pattern width of about 0.1~0.2 $\mu$m in self-alignment, therefore, the increase of a capacity between the base to the collector can be controlled to the minimum.

After the insulating layer 2 has grown on the semiconductor substrate 1, the opening 21 is formed in the region becoming a base. The thickness of the insulating layer 2 is 100 nm approximately, while a material to easily grown selective epitaxy should be chosen for the insulating layer type. In particular, the $SiO_2$ layer is recommended. The etching can control an amount of pattern transformer by using anisotropic etching, however, in the case when RIE (Reactive Ion Etching) is used, it is required to remove a damage layer caused by RIE, by wet etching etc. because damage occurs in the semiconductor substrate. (Refer to FIG. 8)

Afterwards, the BSG layer is formed over the entire insulating layer 2 and the semiconductor substrate 1 including the opening 21. And, this BSG layer is etched by anisotropic etching. At the time point when the semiconductor substrate 1 is exposed, etching is stopped, and the BSG layer remains only in the side surface of the opening 21 as a side-wall insulating layer 16. The thickness of the BSG layer is optimally about 100 to 200 nm and boron density is about $10^{21}$ atoms/$cm^3$. This process can form the side-wall insulating layer which has a width about 100~200 nm. In this case, it is required to remove the damage layer by wet etching etc., because damage occurs due to anisotropic etching. Accordingly, the side-wall insulating layer 16 acts as a diffusion source during annealing under the condition of 850° C., $N_2$ for 30 min approximately to cause boron to diffuse into semiconductor substrate 1, where p-type impurity diffused region 11 is formed. The width of the p-type impurity diffused region 11 is defined at about 300~400 nm and the depth of the same is about 100 nm. This annealing process is not necessarily performed at this time and may be done together with the following emitter diffusion process (refer to FIG. 9). Boron doped selective epitaxial growth layer 3 is formed on the semiconductor substrate containing the insulating layer 2 where BSG side-wall 16 has been formed on opening 21. Preferably the layer thickness is about 50~70 nm and the boron density is 5 to $7 \times 10^{18}$ $cm^{-3}$ approximately. A sharp base profile can be achieved by defining growth temperature at the low temperature of about 700° C.

By using the gas system of $SiH_2Cl_2$ or $SiH_4+HCl$ as a growth gas, the selective epitaxial growth layer 3 is easily formed. The shape of the edge portion of the selective epitaxial growth layer 3 should be a structure where faceting does not occur. Meanwhile, such a problem will be avoided according to this invention when the threshold is particularly decreased, even if slight faceting or a fine defect occurs in the edge portion (refer to FIG. 10).

On the other hand, a polysilicon layer 13 and an insulating layer 14($CVDSiO_2$ layer) doped with p-type impurity in high density are formed in this order. The anisotropic etching is provided to this deposition layer, where the pattern is relieved with anisotropic etching so that the polysilicon semiconductor layer 13 may overlap with the selective epitaxial growth layer 3. The polysilicon layer 13 pattern formed in this process is used as a base contacting electrode. However, low resistance is preferable for reducing parasitic resistance (refer to FIG. 11).

Figure 11:
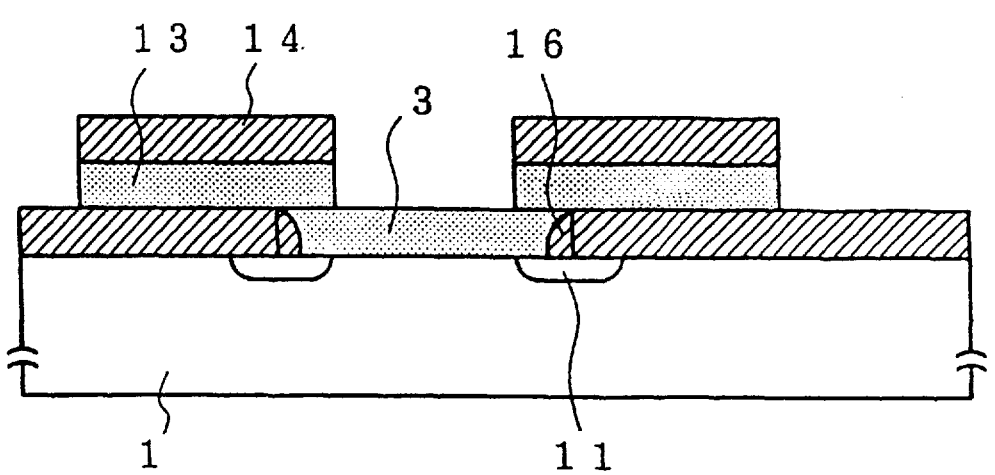
FIG. 11 shows sectional view of the semiconductor device in a manufacturing process in the third embodiment of the invention.
Figure 12:
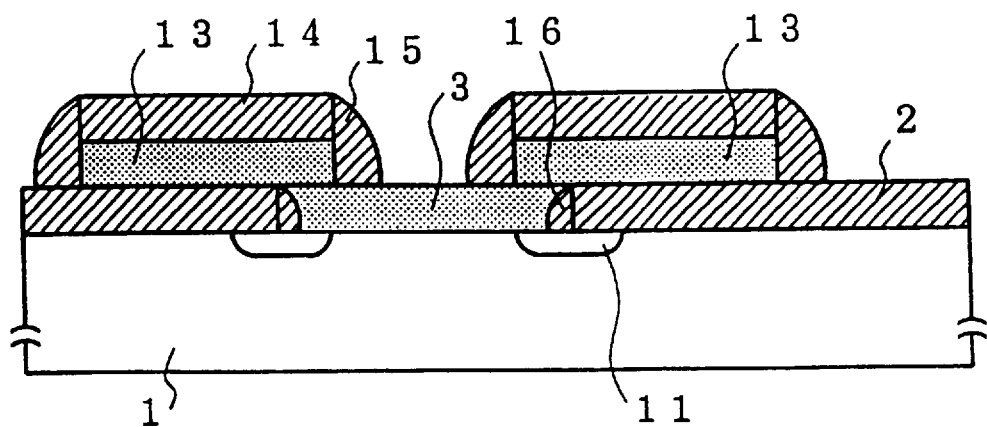
FIG. 12 shows sectional view of the semiconductor device in a manufacturing process in the third embodiment of the invention.
Figure 13:
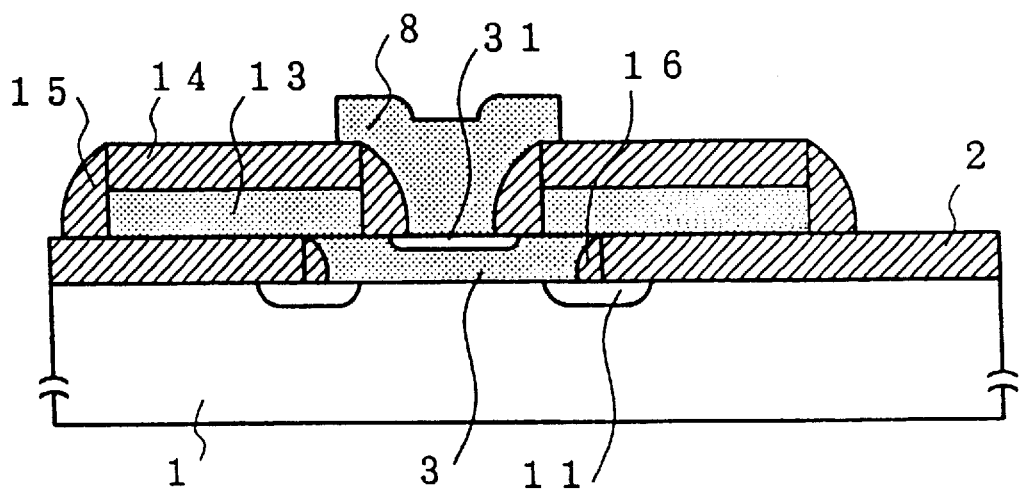
FIG. 13 shows sectional view of the semiconductor device in a manufacturing process in the third embodiment of the invention.

Afterwards, insulating layer 15 is formed in the side surface of the deposition layer pattern which consists of the polysilicon layer 13 fully formed at FIG. 11 by anisotropic etching after growth of the insulating layer 14. This aidewall insulating layer 15 can not only separate the base electrode from the emitter electrode, but also determine an emitter size.

In other words, when the opening width for the deposition layer pattern formed in FIG. 11 is defined at 0.5 μm. The side-wall insulating layer 15 formed in this process is set to 0.15 μm, while the emitter opening width can be defined at about 0.2 μm(refer to FIG. 12). Moreover, a n-type polysilicon layer 8 is formed at the emitter opening, when emitter region 31 is formed by annealing under the condition of 1000° C. and $N_2$, for 20 sec approximately.

Meanwhile, the fourth embodiment is described with reference to FIGS. 14 to 16.

Those embodiments described above selectively grow a p-type epitaxial growth layer only on the surface of the semiconductor substrate, which is exposed to the opening of the insulating layer. However, this embodiment grows the semiconductor layer all over the semiconductor substrate containing the insulating layer and the inside of the opening thereof. Hereafter, this semiconductor layer is called the non-selective epitaxial growth layer.

Figure 14:
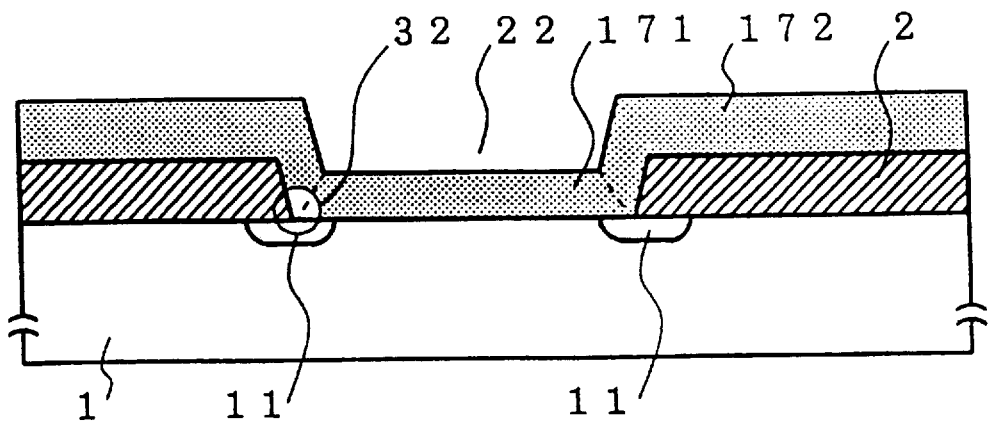
FIG. 14 shows sectional view of the semiconductor device in a manufacturing process in the fourth embodiment of the invention.

First, a insulation layer 2, e.g. 100 nm thick $SiO_2$, is formed on n-type semoiconductor substrate 1 at $1\times10^{16}$ to $1\times10^{17} cm^{-3}$ approximately, as shown in FIG. 14. Then, a p-type impurity, e.g. boron, is implanted by the ion-implantation method to predetermined regions where p-type impurity is diffused of the surface region of the semiconductor substrate 1, and diffused by annealing. A p-type impurity diffused region 11, formed by immediate process, not exceeding the impurity density of $1\times10^{18} cm^{-3}$ is formed in this region.

The diffusion width of this p-type impurity diffused region 11 is about 0.5 to 1.0 μm, and the diffusion depth is about 300 to 500 nm from the surface area of the semiconductor substrate 1. Then, photoresist (not illustrated) is coated and patterned on the insulating layer 2. Etching, e.g. RIE, is performed using the patterned photoresist as a mask, while opening 21 is formed on insulating layer 2. Opening 21 is formed so that the bottom edge is aligned on p-type impurity diffused region 11.

A p-type semiconductor layer 17 which has a thickness about 50 to 70 nm is epitaxially grown on insulating layer 2 and semiconductor substrate 1 enclosed by opening 21. At this time, the low growth temperature of about 700° C. is applied. Non-selective epitaxial growth layer 17 is grown not only on the semiconductor substrate 1 of an opening 21, but also on the insulating layer 2. In this case, single crystal grows on the semiconductor substrate 1, while polycrystal silicon grows on the insulating layer 2.

In other words, this non-selective epitaxial growth layer 17 is composed of single crystal silicon region 171 growing within opening 21, and polysilicon region 172 formed on the insulating layer 2. The bottom edge of opening 21 is located within p-type impurity diffused region 11. For non-selective epitaxial growth layer 17, monocrystal silicon region 171 is formed in opening 21.

However, pattern edge portions of single crystal silicon region 171 are fully formed so as to be accommodated within the p-type impurity diffused region 11 pattern. Hence, even though polysilicon contacts with the substrate in the pattern edge region, the boundary between the epitaxial growth layer and semiconductor substrate interface in the edge region at the opening 21 is protected by the junction formed by p-type impurity diffused region 11 within the semiconductor substrate 1, which is not detected as junction leakage.

Meanwhile, the semiconductor device forming the bipolar transistor using the aforesaid non-selective epitaxial growth layer 17 into the semiconductor substrate, is described with reference to FIGS. 15 and 16.

Figure 15:
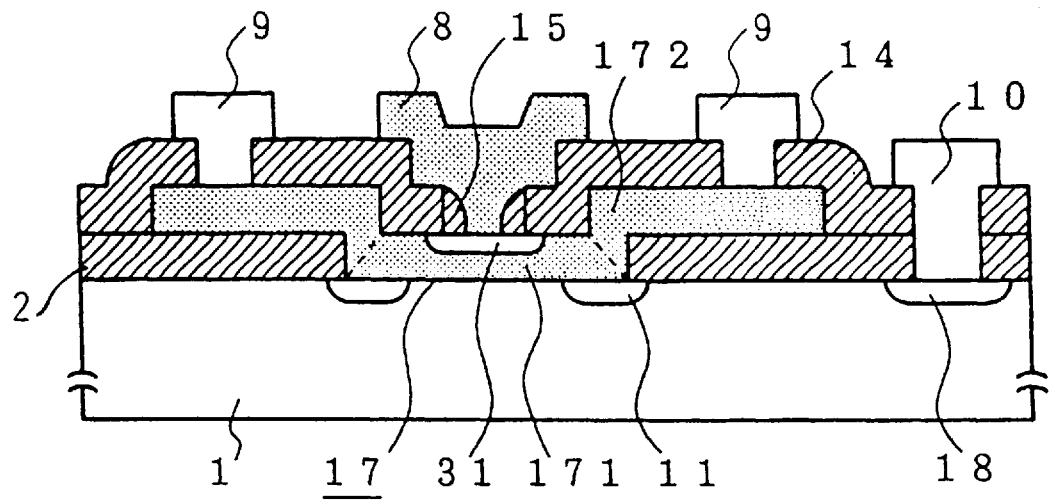
FIG. 15 shows sectional view of the semiconductor device in a manufacturing process in the fourth embodiment of the invention.
Figure 16:
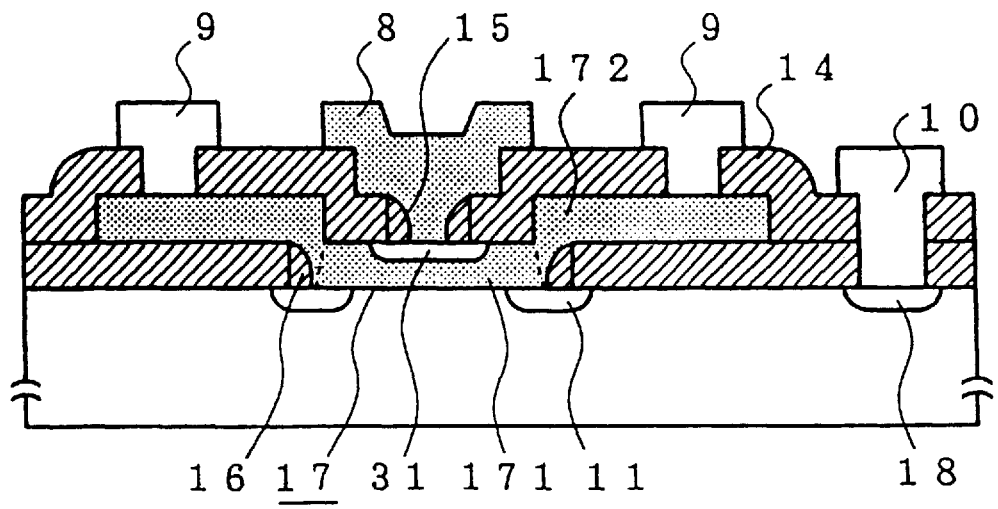
FIG. 16 shows sectional view of the semiconductor device in a manufacturing process in the fourth embodiment of the invention.

FIGS. 15 and 16 show a cross sectional view of the semiconductor substrate on which bipolar transistor is formed. An insulating layer 2, e.g. which is about 100 nm thick SiO2 layer, is formed on n-type silicon semiconductor substrate 1. The impurity, e.g. boron, is implanted into the surface region of the semiconductor substrate 1 via insulating layer 2 by ion implantation, which is diffused, thereby forming a p-type impurity diffusion region 11. Then, an opening 21 is formed in predetermined base-formed region of insulating layer 2. Moreover, silicon semiconductor layer 17 is formed by epitaxial growth, where this opening 21 and insulating layer 2 are doped. The silicon semiconductor layer 17 is composed of single crystal silicon region 171 which is in the opening 21 and polysilicon region 172 which is on the insulating layer 2. This silicon semiconductor layer 17 is patterned in predetermined form.

Furthermore, the insulating layer ($CVDSiO_2$ layer) formed by the CVD method is deposited on patterned silicon semiconductor layer 17. An emitter opening is formed in this insulating layer 14, so that single crystal silicon region 171 is exposed.

A side-wall insulating layer 15, e.g. silicon oxide, is formed on the side surface of the emitter opening. The polysilicon region 172 is used as a base contacting electrode, however, lower resistance is preferred, because it is required to reduce parasitic resistance. Next, n-type polysilicon semiconductor layer 8 is formed on the emitter opening. Next, n-type emitter diffused region 31 is formed on the single crystal silicon region 171 surface by annealing under the condition of 1000° C., $N_2$ and for 20 sec approximately. Furthermore, the boundary between single crystal silicon region 171 and polysilicon region 172 is formed at the edge of the opening 21. On the surface region of the semiconductor substrate 1 contacted the boundary between the single crystal silicon region 171 and the polysilicon region 172, p-type impurity diffused region 11 is formed and aligned. In other words, an edge of single crystal silicone region 17 is formed and aligned. The polysilicon semiconductor layer 8 is used as an emitter electrode. Single crystal silicon region 171 is used as a base region. Polysilicon region 172 is used as an outer base electrode.

Openings are provided to insulating layers 2 and 14 so that each surface layer is exposed, while metallic electrodes 9 and 10 are formed so as to contact the surface layer. Metallic electrode 9 is used as a base extraction electrode.

Metallic electrode 10 is connected to collector contact region 18, having high impurity density for semiconductor substrate 1, and is used as a collector contacting electrode. This p-type impurity diffused region 11 has such a pattern that it contacts the total edge portion of single-crystal silicon region 171, which is not detected as junction leak, if the polysilicon contacts with the substrate in the silicon semiconductor layer 17, which is non-selective epitaxial growth layer. The p-type impurity diffused region 11 is formed in this manner.

The increase in the base/collector junction region may degrade the operating performance for a bipolar transistor. However, by defining the length between the edge portion of single crystal silicon region 171 and that of p-type impurity-diffused region 11, the increase in the capacitance between base and collector can be minimized.

Meanwhile FIG. 16 shows an example using non-selective epitaxial growth layer as well as a semiconductor device in FIG. 15.

FIG. 16 differs from FIG. 15 in what a side-wall insulating layer 16 made of BSG layers is formed at openings in the base region for insulating layer 2.

Silicon semiconductor layer 17 is formed at the opening by boron-doped non-selective epitaxial growth. Single crystal silicon region 171 of silicon semiconductor layer 17 is aligned opposing against insulating layer 2 via the side-wall insulating layer 16 at the opening. Side-wall insulating layer 16 is grown in a diffusion source, when the impurity diffused region is formed on the region surface of semiconductor substrate 1, in addition to adjusting the opening width in insulating layer 2.

Figure 17:
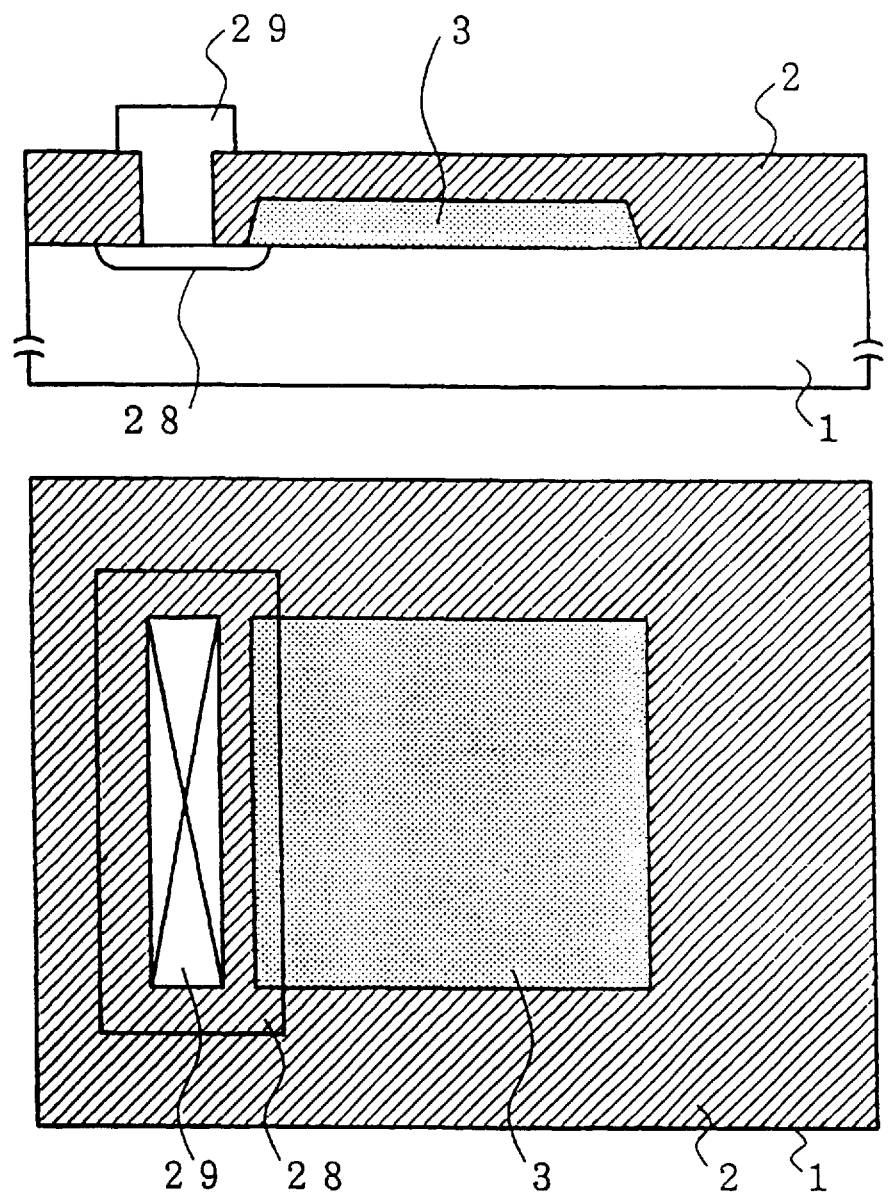
FIG. 17 shows a sectional view and a plan view of the semiconductor substrate and describes the effect of this invention.
Figure 18:
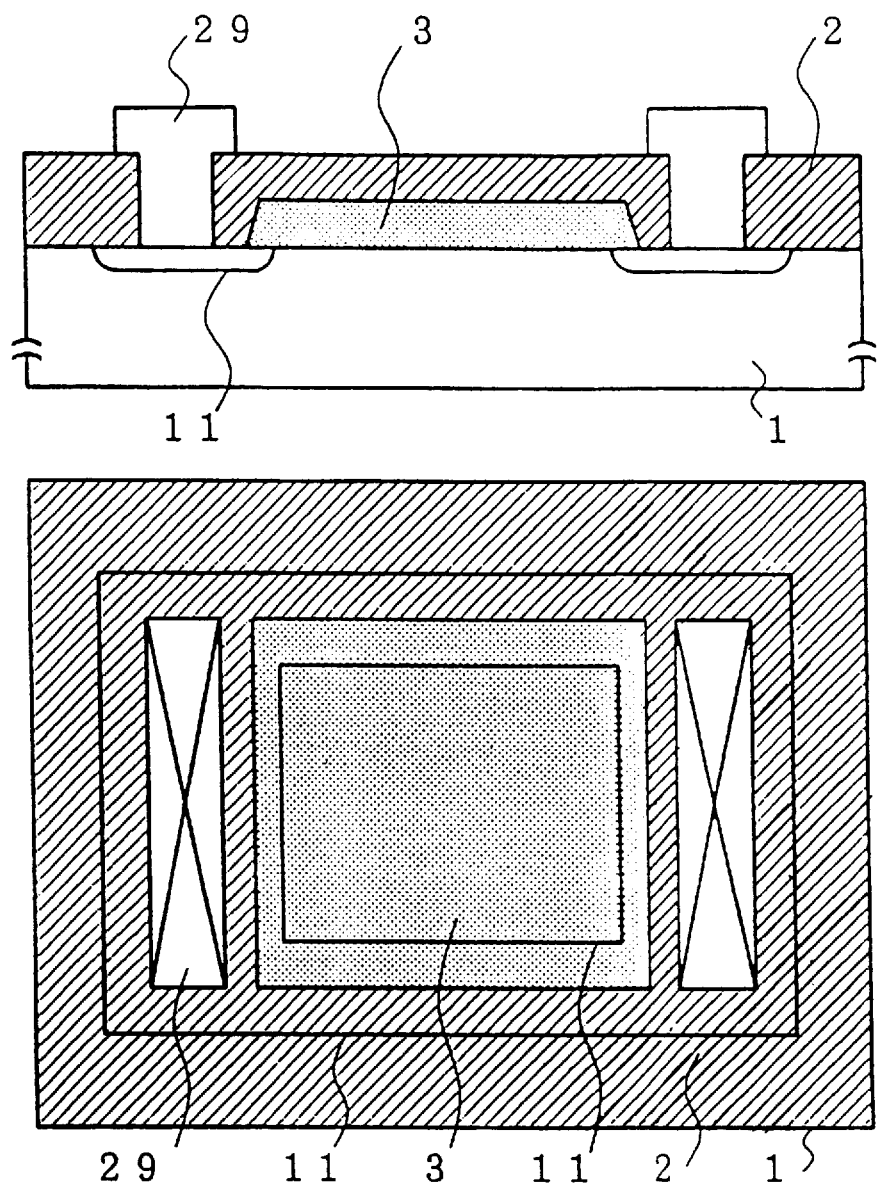
FIG. 18 shows a sectional view and a plan view of the semiconductor substrate and describes the effect of this invention.

On the other hand, the effects of impurity diffused region 11, on the pattern edge of epitaxial growth layer are described as one of the aspects of this invention. As shown in FIGS. 17 and 18, p-type epitaxial growth layer is formed on semiconductor substrate 1, and the selective opitaxial growth layer 3 is coated with insulating layer 2, e.g. $SiO_2$.

Epitaxial growth layer 3 and semiconductor substrate 1 form a diode. For the diode, a p-type impurity diffused region is formed on the surface region of semiconductor substrate 1 and connected to metallic electrode 29.

P-type impurity diffused region 28 is formed on semiconductor substrate 1, as shown in FIG. 17, and p-type impurity diffused region 11 is formed on semiconductor substrate 1, as shown in FIG. 18. As shown in the FIGS. 17, 18, a faceting corner (See the four sides of layer 3 shown in the plan view of FIGS. 17 and 18) is formed in each epitaxial growth layer. This position allows the easy generation of junction leakage between opitaxial growth layer and semiconductor substrate.

FIG. 17 shows that one portion (one side only) is mounted on the p-type impurity diffused region, and FIG. 18 shows that all the faceting corners are mounted on the p-type impurity diffused region. Therefore, both FIGS. 17 and 18 illustrate embodiments of this invention, while, FIG. 17 is a illustrates a comparison with FIG. 18 to show the effects in a diffused region.

Figure 19:
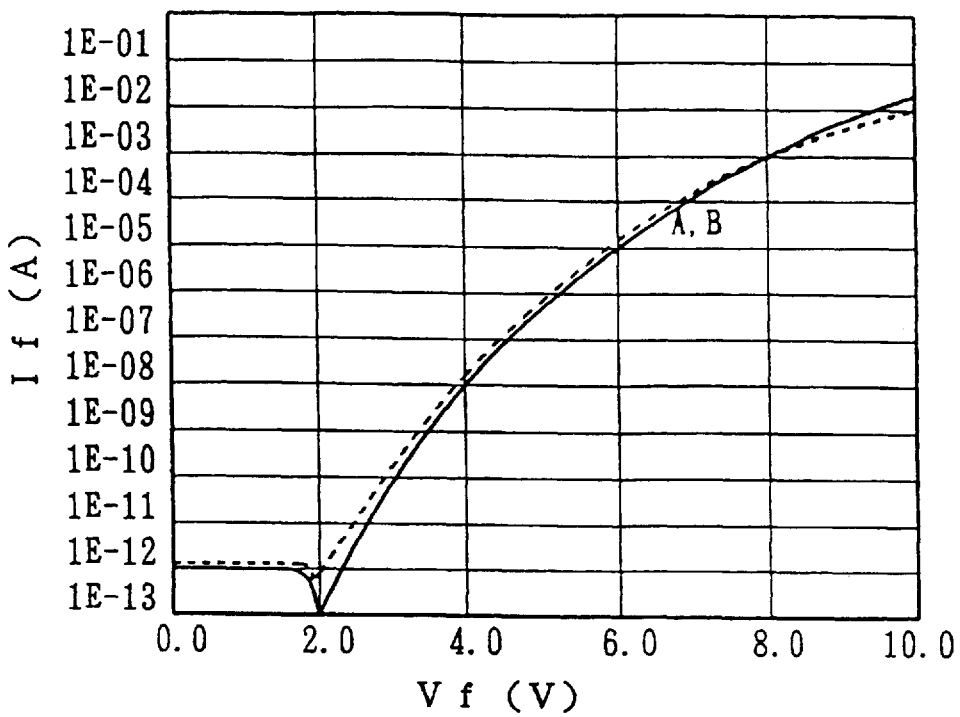
FIG. 19 shows a characteristics view of forward current—voltage of a diode.
Figure 20:
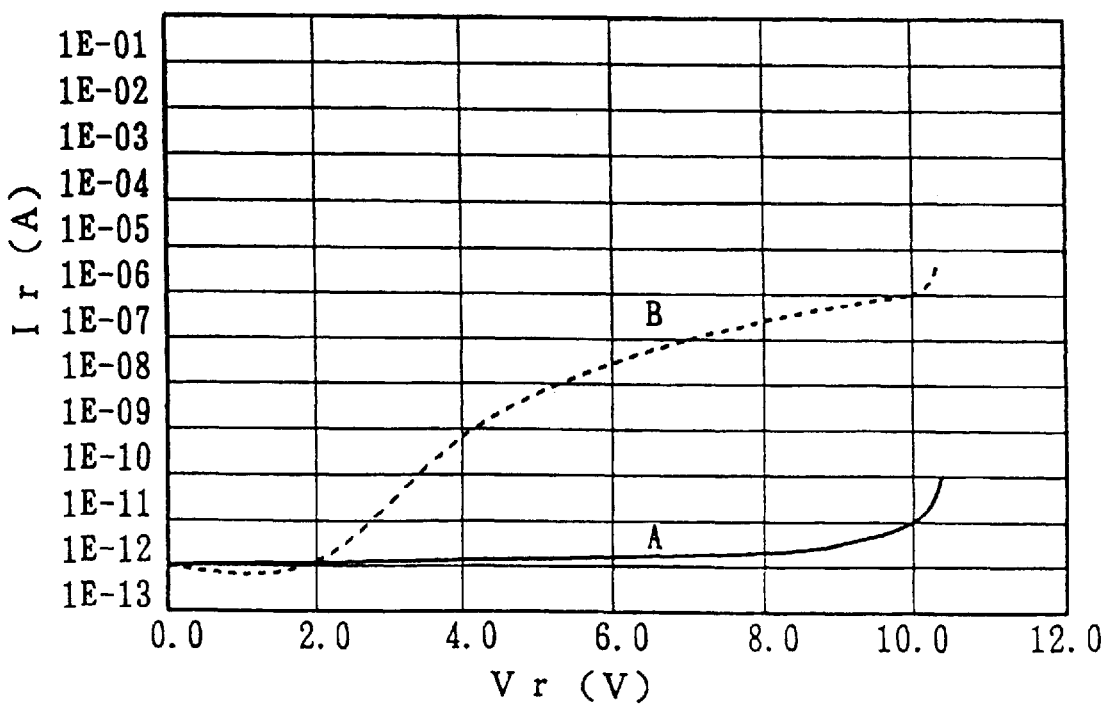
FIG. 20 shows a characteristics view of forward current—voltage of a diode.

FIGS. 19 and 20 show both forward and reverse current—voltage characteristics. In these characteristics, the vertical axis indicates the current, and the horizontal axis indicates the voltage. Curve A indicates diode characteristics concerning the invention shown in FIG. 18, while curve B shows diode characteristics as a reference example in FIG. 17. The comparison of both curves shows that they almost entirely correspond to each other, allowing leakage because of larger current variation in curve B for reverse characteristics (Ir-Vr Characteristics).

For the application of the invention to an epitaxial base type bipolar transistor, base impurity density (p-type) has a range from $1 \times 10^{18} cm^{-3}$ to $1 \times 10^{19} cm^{-3}$, and collector impurity density (n-type) has a range from about $1 \times 10^{16} cm^{-3}$ to $1 \times 10^{17} cm^{-3}$.

Figure 1:
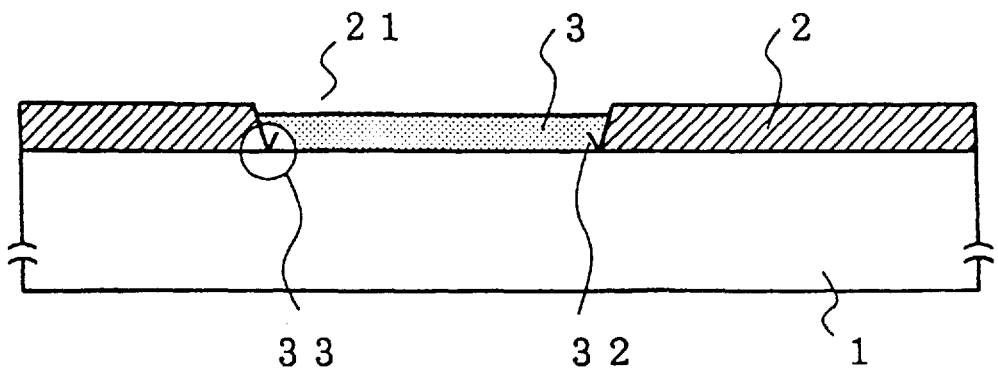
FIG. 1 shows a sectional view of a conventional semiconductor device.
Figure 2:
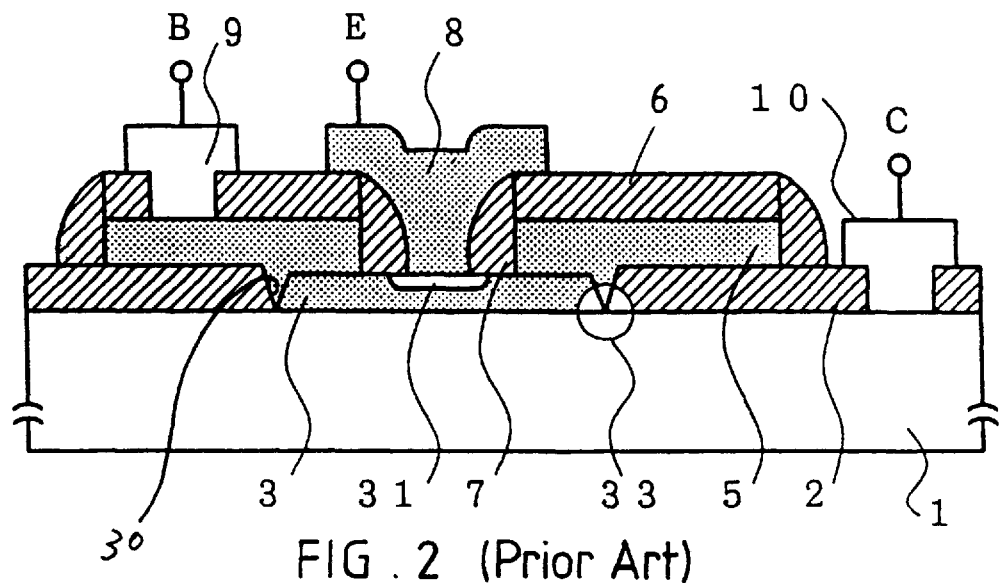
FIG. 2 shows a sectional view of a conventional semiconductor device.

However, even if the impurity density of p-type impurity diffused region 11 (See FIG. 1), which is a characteristic of this invention, is estimated at a low value of $1 \times 10^{18} cm^{-3}$, it can withstand up to 20 V, if the length from edge portion of the insulating layer 2 opening to that of p-type impurity diffused region, or the depth from the substrate surface, is about 0.5 $\mu$m.

Therefore, the length (x) from the opening pattern edge of insulating layer 2 to that of p-type impurity diffused region 11 should be 0.5 to 2.0 $\mu$m. The application of this invention allows the increase in junction capacitance. However, the junction capacitance can be minimized by setting the distance from the pattern edge of said opening to that of the impurity diffused region at lees than 2 $\mu$m.

The effects of this invention can control the increase in junction leak current and decrease in voltage, even if a defect or faceting should occur at the pattern edge of the selective/non-selective epitaxial layers in devices using selective/non selective epitaxial layers, which can avoid the threshold of the semiconductor device from falling.

In addition, means to inhibit the increase in junction capacitance forms the same conductivity type impurity diffusion as the epitaxial growth layer, using as a diffusion source an insulator layer formed on a side wall of the opening portion of the insulating layer, which will grow in an epitaxial growth region, and forms a diffusion layer having very small width value, which can minimize the increase in the number of process.

Furthermore, self-matching formation against the opening pattern of the insulating layer, which will grow in an epitaxial growth region, can control the number of processes without adding a photoresist process.

While there has been illustrated and described what are presently considered to be the preferred embodiments of the present invention, it will be understood by those skilled in the art that various changes and modifications may be made, and equivalents may be substituted for devices thereof without departing from the true scope of the invention. In addition many modifications may be made to adapt a particular situation or material to the teaching of the present invention without departing from the central scope thereof. Therefore, it is intended that this invention not be limited to the particular embodiment disclosed as the best mode contemplated for carrying out this invention, but that the invention include all embodiments falling within the scope of the appended claims.

What is claimed is:

1. A semiconductor device, comprising:
   a semiconductor substrate having a first conductivity;
   a first insulating layer formed on said semiconductor substrate and having an opening so that a portion of said semiconductor substrate is exposed;
   an epitaxial layer having a second conductivity and formed on said entire exposed portion of said semiconductor substrate; and
   means, formed in a surface of said semiconductor substrate so that said means comes into contact with an edge of said epitaxial layer, for minimizing a leakage current caused by a minute defect or faceting in said semiconductor layer.

2. The semiconductor device according to claim 1, wherein said means comprises an impurity diffused region having the second conductivity.

3. The semiconductor device according to claim 1, wherein said means contacts an edge portion of said opening.

4. The semiconductor device according to claim 2, wherein said impurity diffused region has boron as an impurity.

5. The semiconductor device according to claim 2, wherein said impurity diffused region has an impurity density above $1 \times 10^{18} cm^{-3}$.

6. The semiconductor device according to claim 1, further comprising:
   a second insulating layer formed on said epitaxial layer and said first insulating layer, and having several openings so that first portions of said epitaxial layer and said semiconductor substrate are exposed;
   an emitter region diffused in one of said first portions,
   an emitter electrode electrically contacting said emitter region; and a base electrode contacting another portion of said first portions.

7. The semiconductor device according to claim 1, further comprising:

a polysilicon layer as an outer base region, formed on said epitaxial layer and said first insulating layer, and having a plurality of first openings, wherein one of said first openings exposes a first portion of said epitaxial layer;

a second insulating layer formed on said polysilicon layer, having a plurality of second openings aligned with said first openings;

a side-wall insulating layer formed along side surfaces of said polysilicon layer and said second insulating layer;

an emitter region, diffused in one of said first openings;

an emitter electrode, electrically contacting said emitter region; and a base electrode, contacting said polysilicon layer.

8. The semiconductor device according to claim 7, further comprising:

a side-wall insulating layer formed along said opening in said first insulating layer.

9. A semiconductor device, comprising:

a semiconductor substrate having a first conductivity;

a first insulating layer formed on said semiconductor substrate, and having an opening so that a portion of said semiconductor substrate is exposed;

an epitaxial layer, having a second conductivity, formed on said exposed portion of said semiconductor substrate and on said insulating layer; and an impurity diffused region, having said second conductivity, formed in a surface of said semiconductor substrate and facing an edge of said opening, wherein the portion of said epitaxial layer formed on said semiconductor substrate is a single crystal silicon region and the portion of said epitaxial layer formed on said insulating layer is a polysilicon region.

10. The semiconductor device according to claim 9, further comprising:

a side-wall insulating layer formed along said opening.

11. The semiconductor device according to claim 9, wherein an impurity density of said impurity diffused layer is higher than an impurity density of said semiconductor substrate.

12. The semiconductor device according to claim 11, wherein said impurity diffused region has boron as an impurity.

13. The semiconductor device according to claim 12, wherein said impurity diffused region has an impurity density above $1 \times 10^{18} cm^{-3}$.

14. The semiconductor device according to claim 9, further comprising:

a second insulating layer formed on said epitaxial layer, having a plurality of first openings so that a plurality of portions of said epitaxial layer are exposed;

a side-wall insulating layer formed along a side surface of one of said first openings in said second insulating layer;

an emitter region, diffused in one of said first openings in said second insulating layer, contacting said side-wall insulating layer;

an emitter electrode, electronically contacting said emitter region; and a base electrode, contacting said epitaxial layer.

15. The semiconductor device according to claim 14, further comprising;

a side-wall insulating layer formed along said opening in said first insulating layer.

* * * * *